(12) United States Patent
Son

(10) Patent No.: US 9,105,872 B2
(45) Date of Patent: Aug. 11, 2015

(54) DISPLAY DEVICE AND METHOD OF MANUFACTURING THE SAME

(71) Applicant: Samsung Display Co., Ltd., Gyeonggi-do (KR)

(72) Inventor: Jung-Hyun Son, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/268,117

(22) Filed: May 2, 2014

(65) Prior Publication Data
US 2014/0346535 A1   Nov. 27, 2014

(30) Foreign Application Priority Data
May 27, 2013   (KR) .................. 10-2013-0059789

(51) Int. Cl.
*H01L 51/52*   (2006.01)
*H01L 51/56*   (2006.01)
*H01L 27/12*   (2006.01)
*H01L 23/29*   (2006.01)

(52) U.S. Cl.
CPC .......... *H01L 51/5253* (2013.01); *H01L 23/293* (2013.01); *H01L 27/1262* (2013.01); *H01L 51/56* (2013.01); *H01L 2251/56* (2013.01)

(58) Field of Classification Search
None
See application file for complete search history.

(56) References Cited

U.S. PATENT DOCUMENTS

2007/0172971 A1* 7/2007 Boroson .................... 438/26
2012/0313508 A1* 12/2012 Son et al. .................. 313/504
2014/0346477 A1* 11/2014 Chao et al. ................. 257/40

FOREIGN PATENT DOCUMENTS

| KR | 10-2008-0026758 A | 3/2008 |
| KR | 10-2010-0129693 A | 12/2010 |
| KR | 10-2012-0011796 A | 2/2012 |
| KR | 10-2012-0119100 A | 10/2012 |

OTHER PUBLICATIONS

Topas Cyclic Olefin CoPolymer downloaded from URL< https://web.archive.org/web/20120115000000*/http://www.polyplastics.com/en/product/lines/topas/general_e.pdf > on Dec. 12, 2014 corresponding the screen capture of Feb. 25, 2012.*
Wayback Time Machine for URL <http://www.polyplastics.com/en/product/lines/topas/general_e.pdf>.*

* cited by examiner

*Primary Examiner* — Joseph Schoenholtz
(74) *Attorney, Agent, or Firm* — Lee & Morse, P.C.

(57) ABSTRACT

A display device includes a display substrate, an encapsulation substrate facing the display substrate, a filling material between the display substrate and the encapsulation substrate, the filling material including a norbornene-based resin, and a sealing material joining the display substrate with the encapsulation substrate.

23 Claims, 2 Drawing Sheets

DISPLAY DEVICE AND METHOD OF MANUFACTURING THE SAME

CROSS-REFERENCE TO RELATED APPLICATION

Korean Patent Application No. 10-2013-0059789, filed on May 27, 2013, in the Korean Intellectual Property Office, and entitled: "Display Device and Method of Manufacturing the Same," is incorporated by reference herein in its entirety.

BACKGROUND

1. Field

Embodiments relate to a display device and a method of manufacturing the same.

2. Description of the Related Art

Currently known display devices include a liquid crystal display (LCD), a plasma display panel (PDP), an organic light emitting diode display (OLED), a field effect display (FED), an electrophoretic display device, and the like.

SUMMARY

Embodiments are directed to a display device including a display substrate, an encapsulation substrate facing the display substrate, a filling material between the display substrate and the encapsulation substrate, the filling material including a norbornene-based resin, and a sealing material joining the display substrate with the encapsulation substrate.

The norbornene-based resin may include a cycloolefin copolymer including a norbornene-based monomer.

The filling material may have pores.

The pores may have a pore diameter of about 1 nm to about 10 nm.

The pore may have a circular or oval shape.

A layer including the filling material may have a thickness of about 1 μm to about 100 μm.

The filling material may further include a nano-pore-forming agent.

The nano-pore-forming agent may include at least one selected from a cyclic ester oligomer, a linear ester oligomer, and a copolymer of a cyclic ester and a linear ester.

The nano-pore-forming agent may include at least one selected from methylmethacrylate, hydroxyethylmethacrylate, dimethylamino ethylmethacrylate, ethylene oxide, propylene oxide, an oligomer thereof, and a copolymer thereof.

The encapsulation substrate may include aluminum, copper, tungsten, an alloy thereof, or a combination thereof.

The display device may further include a getter between the display substrate and the encapsulation substrate.

The display substrate may include a base substrate, a pair of electrodes facing each other on the base substrate, and an organic emission layer between the pair of electrodes.

Embodiments are also directed to a method of manufacturing a display device including preparing a filling material including a norbornene-based resin, applying the filling material between a display substrate and an encapsulation substrate to form a porous thin film, and joining the display substrate with the encapsulation substrate by applying a sealing material.

The norbornene-based resin may include a cycloolefin copolymer including a norbornene-based monomer.

Preparing the filling material may include adding a nano-pore-forming agent to the norbornene-based resin.

The nano-pore-forming agent may include at least one selected from a cyclic ester oligomer, a linear ester oligomer, a copolymer thereof.

The nano-pore-forming agent may include at least one selected from methylmethacrylate, hydroxyethylmethacrylate, dimethylamino ethylmethacrylate, ethylene oxide, propylene oxide, an oligomer thereof, and a copolymer thereof.

The porous thin film may be formed by applying the filling material, heat-treating the filling material at about 90° C. to about 200° C. under air, and increasing a temperature to about 250° C. to about 400° C. under a nitrogen atmosphere or vacuum.

The porous thin film may be formed by applying the filling material using a film adhering method or a liquid coating method.

The porous thin film may be formed by applying the filling material using the liquid coating method, the liquid coating method including spin coating, screen printing, inkjet, ODF (one drop filling), or a combination thereof.

The porous thin film may have a pore.

The pore may have a circular or oval shape.

The filling material may include particles having a particle diameter of about 1 nm to about 10 nm.

The porous thin film may have a thickness of about 1 μm to about 100 μm.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
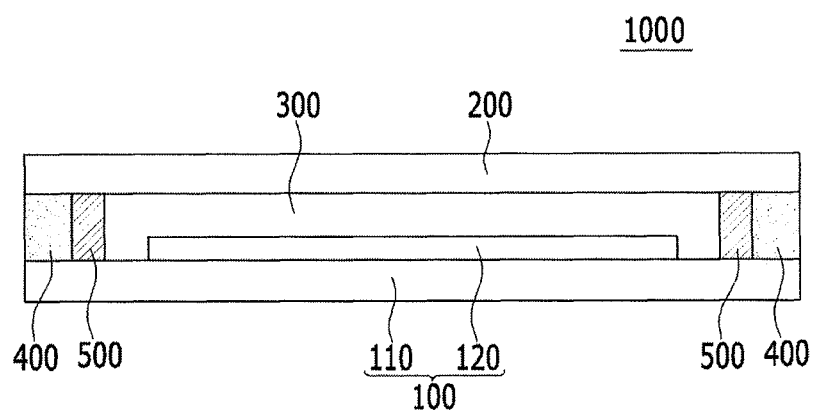
FIG. 1 illustrates a cross-sectional view of an organic light emitting diode (OLED) display according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Hereinafter, a display device according to an embodiment is described. Herein, as an example of a display device, an organic light emitting diode (OLED) display is described.

FIG. 1 illustrates a cross-sectional view of an organic light emitting diode (OLED) display according to an embodiment.

Referring to FIG. 1, a display device 1000 may include a display substrate 100, an encapsulation substrate 200, a filling material 300, and a sealing material 400.

The display substrate 100 may include a base substrate 110 and a display element 120.

The base substrate 110 may be a glass substrate or a polymer substrate.

The display element 120 may be formed on the base substrate 110 and may include a device area in which an active device such as a thin film transistor (TFT) is formed and a light-emitting area in which an emission layer is formed. The device area may be separated from or overlapped with a display area. The display element 120 is described below.

The encapsulation substrate 200 may be positioned to face the display substrate 100 and may be made of, for example, aluminum (Al) or an aluminum (Al)-containing metal such as an aluminum (Al) alloy.

The encapsulation substrate 200 may prevent oxygen and moisture from flowing in from an external environment and may protect the display element 120 therefrom.

The encapsulation substrate 200 may be, for example, a single-layer formed of one aluminum-containing metal sheet or a multi-layer formed by stacking aluminum-containing metal sheets. The encapsulation substrate 200 may be about 1 µm to about 1,000 µm thick. When the encapsulation substrate 200 has a thickness within this range, the encapsulation substrate 200 may have sufficient thickness to prevent thermal bending as well as to effectively prevent oxygen and moisture from externally flowing in.

The encapsulation substrate 200 may include a metal, for example aluminum (Al), copper (Cu), tungsten (W), an alloy thereof, or a combination thereof.

The sealing material 400 may join the display substrate 100 and the encapsulation substrate 200 and may be disposed, for example, along the edge of the display substrate 100. The sealing material 400 may be formed of, for example, a thermosetting and/or a photocurable resin such as an epoxy resin and an acryl-based resin.

The filling material 300 may fill in an area defined by the sealing material 400. The filling material 300 may form a thin film between the display substrate 100 and the encapsulation substrate 200 and may absorb an external impact applied to the display device 1000.

The filling material 300 may include a norbornene-based resin. The term "norbornene-based resin" refers to a resin that includes a norbornene group. For example, the norbornene-based resin may include a cycloolefin copolymer including a norbornene-based monomer.

The cycloolefin copolymer may include a copolymer containing a hydroxy group and a trialkyloxysilyl group, such that the cycloolefin copolymer may react with nano-pore-forming agent, described below.

The cycloolefin copolymer including a norbornene-based monomer may include a copolymer prepared by using an olefin and cycloolefin as a chain transfer agent.

The norbornene-based monomer may include, for example 5-norbornene-2-methanol, cis-5-endo-2,3-dicarboxylic anhydride, or dicyclopentadiene.

The norbornene-based resin may be a thermally-stable and low dielectric high-molecular copolymer.

The norbornene-based resin may be a copolymer synthesized by using norbornene, dicyclopentadiene, and a norbornene derivative as monomers and having a glass transition temperature ranging from about 250° C. to 450° C. For example, the norbornene-based resin may be a norbornene-based cycloolefin copolymer and a dicyclopentadiene cycloolefin copolymer.

The norbornene-based resin may be a compound having a characteristic of being transformed when bent or twisted but of maintaining a shape unless a force is applied thereto and thus, having excellent impact absorption.

When the norbornene-based resin is used as the filling material 300, the norbornene-based resin may effectively absorb an external impact applied to the display device 1000 and may maintain a constant gap among layers of the display device 1000. In addition, the norbornene-based resin may seal an irregular surface with a low pressure and thus, may minimize unfilled parts.

The norbornene-based resin may have excellent high temperature stability and thus, excellent storage reliability. The norbornene resin may avoid the generation of dark spots and the like during long-term storage of the display device.

The filling material 300 may include a particle having a nano-sized diameter, for example, a diameter ranging from about 1 nm to about 10 nm. When the filling material 300 has a particle diameter within this range, the refractive index of the filling material 300 may be easily adjusted, and thus, the display device 1000 may be a top-emitting panel.

The filling material 300 may further include a nano-pore-forming agent.

The nano-pore-forming agent may include a suitable compound that is pyrolyzed at a lower temperature than the glass transition temperature of the norbornene-based resin. For example, the nano-pore-forming agent may be a compound that is pyrolyzed at a temperature ranging from about 250° C. to 400° C. The nano-pore-forming agent may include, for example, an oligomer of cyclic ester such as lactide, glycolide, or caprolactone, an oligomer of linear ester such as lactic acid or glycolic acid, or a copolymer thereof. The nano-pore-forming agent may include, for example at least one selected from methylmethacrylate, hydroxyethylmethacrylate, dimethylamino ethylmethacrylate, ethylene oxide, propylene oxide, an oligomer thereof, and a copolymer thereof.

The nano-pore forming agent may form a pore in the filling material having a circular or oval shape. For example, the nano-pore forming agent may form a plurality of pores in the filling material having the circular or oval shape The filling material 300 may be filled between the display substrate 100 and the encapsulation substrate 200 and may forms a thin film. The thin film may have a thickness ranging from, for example, about 1 µm to about 100 µm. When the thin film has a thickness within this range, sufficient impact resistance may be secured.

The display device 1000 may further include a getter 500 between display substrate 100 and the encapsulation substrate 200.

Hereinafter, the display element 120 of the display device is illustrated referring to FIG. 2 along with FIG. 1.

Figure 2:
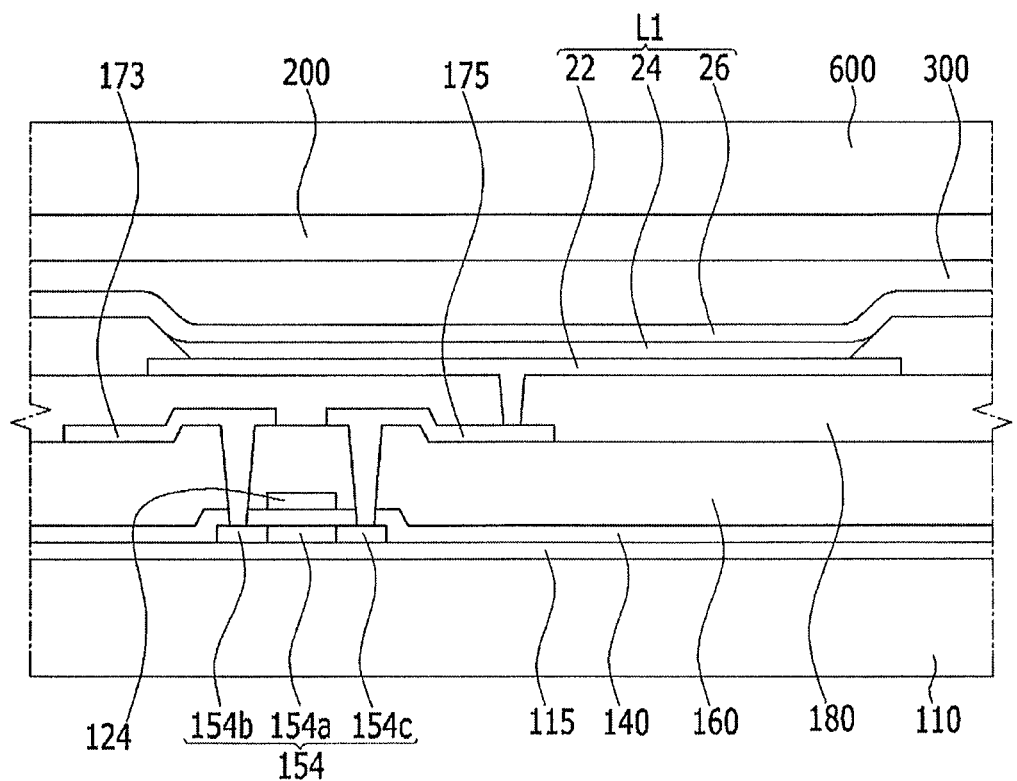
FIG. 2 illustrates a schematic view enlarging the display element of FIG. 1.

FIG. 2 illustrates a schematic view enlarging the display element 120 of FIG. 1.

Referring to FIG. 2, a buffer layer 115 may be formed on a base substrate 110. A semiconductor layer 154 including a channel area 154a, a source area 154b, and a drain area 154c, a gate insulating layer 140, a gate electrode 124, an intermediate layer 160, a source electrode 173, a drain electrode 175, and a passivation film 180 may be sequentially stacked on the buffer layer 115.

On the passivation film 180, a lower electrode 22, an emission layer 24, and an upper electrode 26 may be sequentially stacked, forming one light emitting element L1.

Hereinafter, a method of manufacturing the aforementioned display device is illustrated.

A method of manufacturing a display device according to an embodiment includes preparing a filling material using a norbornene-based resin, applying the filling material between a display substrate and an encapsulation substrate to form a porous thin film, and joining the display substrate with the encapsulation substrate using a sealing material.

In the preparation of the filling material, the filling material may primarily include a norbornene-based resin and additionally may include a nano-pore-forming agent. The norbornene-based resin and the nano-pore-forming agent are described above and thus, a description thereof will not be repeated.

Hereinafter, the formation of the porous thin film is described. The porous thin film may be formed by applying the filling material and heat-treating the same. The formation of the porous thin film may further include a heat-treatment at about 90° C. to about 200° C. in air after applying the filling material. The heat-treatment at the temperature may remove a remaining solvent.

Subsequently, the formation of the porous thin may include heat-treatment at a temperature ranging from about 250° C. to about 400° C. under a nitrogen atmosphere or vacuum. The film may have a nano-sized pore. The thin film may be formed by pyrolyzing an organic component used as a nano-pore-forming agent rather than cross-linking or curing the filling material.

The formation of the porous thin film may further include applying the filling material in a film-attaching method or a liquid-coating method.

The liquid coating method may include, for example spin coating, screen printing, inkjet, ODF (one drop filling), or a combination thereof.

The display substrate and the encapsulation substrate may be joined by applying a sealing material 400 along the edge of the display substrate 100.

Instead of curing a polymer resin, the above method may use a pyrolyzable polymer that has a pyrolysis temperature that is lower than a glass transition temperature of a matrix polymer and forms a thin film having a desired refractive index by introducing a nano-pore into a polymer thin film due to pyrolysis. The thin film may be used as a filling material.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXPERIMENTAL EXAMPLE 1

A sample panel was manufactured by forming a norbornene polymer filling material layer on an encapsulation substrate, and then bonding the resultant with a display substrate. The norbornene polymer filling material layer was 5 μm thick.

EXPERIMENTAL EXAMPLE 2

A sample panel was manufactured according to the same method as Experimental Example 1 except for forming a 10 μm-thick norbornene polymer filling material layer.

EXPERIMENTAL EXAMPLE 3

A sample panel was manufactured according to the same method as Experimental Example 1 except for forming nano-pores having a pore diameter of 10 nm in the filling material.

EXPERIMENTAL EXAMPLE 4

A sample panel was manufactured according to the same method as Experimental Example 2 except for forming nano-pores having a pore diameter of 10 nm in the filling material.

COMPARATIVE EXPERIMENTAL EXAMPLE 1

A sample panel was manufactured according to the same method as Experimental Example 1 except for using no filling material.

COMPARATIVE EXPERIMENTAL EXAMPLE 2

A sample panel was manufactured according to the same method as Experimental Example 1 except for using an epoxy polymer as a filling material.

COMPARATIVE EXPERIMENTAL EXAMPLE 3

A sample panel was manufactured according to the same method as Comparative Experimental Example 2 except for forming the filling material layer to be 10 μm thick.

Evaluation

The sample panels according to Experimental Examples 1 to 4 and Comparative Experimental Examples 1 to 3 were stored under a RH condition of 85° C./85% and under illumination. The amount of time that it took for a dark spot to be produced in each sample panel was measured.

In addition, whether the sample panels according to Experimental Examples 1 to 4 and Comparative Experimental Examples I to 3 were broken or not was examined after a 10 g SUS ball was dropped from a predetermined height.

The results are provided in Table 1.

TABLE 1

| | Experimental Example 1 | Experimental Example 2 | Experimental Example 3 | Experimental Example 4 | Comparative Experimental Example 1 | Comparative Experimental Example 2 | Comparative Experimental Example 3 |
|---|---|---|---|---|---|---|---|
| Dark spots producing time (h) | 2,000 | 2,000 | 2,000 | 2,000 | 2,000 | 1,000 | 800 |
| Height at which defects occur when ball is dropped | Defects occur when ball is dropped from 20 cm | Defects occur when ball is dropped from 30 cm | Defects occur when ball is dropped from 20 cm | Defects occur when ball is dropped from 20 cm | Defects occur when ball is dropped from 5 cm | Defects occur when ball is dropped from 15 cm | Defects occur when ball is dropped from 20 cm |

Referring to Table 1, while the sample panel according to Comparative Experimental Example 2 showed a dark spot-producing time of 1,000 hours and the sample panel according to Comparative Experimental Example 3 showed only a dark spot-producing time of 800 hours, the sample panels according to Experimental Examples 1 to 4 showed a dark spot-producing time of 2,000 hours. Thus, the sample panels according to Comparative Experimental Examples 2 and 3 showed a deteriorated storage reliability as compared with the sample panels according to Experimental Examples 1 to 4.

In addition, while the panels according to Experimental Examples 1 to 4 showed a defect when the ball fell from a height of 20 cm, the sample panels according to Comparative Experimental Examples 1 and 2 showed a defect when respectively dropped from a height of 5 cm and 15 cm. Thus, the sample panels according to Comparative Experimental Examples 1 and 2 showed a deteriorated impact resistance compared with the sample panels according to Experimental Examples 1 to 4.

By way of summation and review, a general display device may include a display substrate including a thin film transistor, an emission layer, and the like, and an encapsulation substrate covering the display substrate. A filling material may be filled between the display substrate and the encapsulation substrate. It is desirable that the filling material have excellent high temperature stability and impact absorption to secure reliability of the display device.

Embodiments provide a display device having improved reliability by using a filling material having excellent high temperature stability and impact absorption. Embodiments also provide a method of manufacturing the display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display substrate,
   an encapsulation substrate facing the display substrate,
   a filling material between the display substrate and the encapsulation substrate, the filling material including a norbornene-based resin, wherein the filling material includes pores, and
   a sealing material joining the display substrate with the encapsulation substrate.

2. The display device as claimed in claim 1, wherein the norbornene-based resin includes a cycloolefin copolymer including a norbornene-based monomer.

3. The display device as claimed in claim 1, wherein the pores have a pore diameter of about 1 nm to about 10 nm.

4. The display device as claimed in claim 1, wherein the pores have a circular or oval shape.

5. The display device as claimed in claim 1, wherein a layer including the filling material has a thickness of about 1 µm to about 100 µm.

6. A display device, comprising:
   a display substrate,
   an encapsulation substrate facing the display substrate,
   a filling material between the display substrate and the encapsulation substrate, the filling material including a norbornene-based resin, and
   a sealing material joining the display substrate with the encapsulation substrate,
   wherein the filling material further includes a nano-pore-forming agent.

7. The display device as claimed in claim 6, wherein the nano-pore-forming agent includes at least one selected from a cyclic ester oligomer, a linear ester oligomer, and a copolymer of a cyclic ester and a linear ester.

8. The display device as claimed in claim 6, wherein the nano-pore-forming agent includes at least one selected from methylmethacrylate, hydroxyethylmethacrylate, dimethylamino ethylmethacrylate, ethylene oxide, propylene oxide, an oligomer thereof, and a copolymer thereof.

9. The display device as claimed in claim 1, wherein the encapsulation substrate includes aluminum, copper, tungsten, an alloy thereof, or a combination thereof.

10. The display device as claimed in claim 1, further comprising a getter between the display substrate and the encapsulation substrate.

11. The display device as claimed in claim 1, wherein the display substrate includes
    a base substrate,
    a pair of electrodes facing each other on the base substrate, and
    an organic emission layer between the pair of electrodes.

12. A method of manufacturing a display device, the method comprising
    preparing a filling material including a norbornene-based resin,
    applying the filling material between a display substrate and an encapsulation substrate to form a porous thin film, and
    joining the display substrate with the encapsulation substrate by applying a sealing material.

13. The method as claimed in claim 12, wherein the norbornene-based resin includes a cycloolefin copolymer including a norbornene-based monomer.

14. The method as claimed in claim 12, wherein preparing the filling material includes adding a nano-pore-forming agent to the norbornene-based resin.

15. The method as claimed in claim 14, wherein the nano-pore-forming agent includes at least one selected from a cyclic ester oligomer, a linear ester oligomer, a copolymer thereof.

16. The method as claimed in claim 15, wherein the nano-pore-forming agent includes at least one selected from methylmethacrylate, hydroxyethylmethacrylate, dimethylamino ethylmethacrylate, ethylene oxide, propylene oxide, an oligomer thereof, and a copolymer thereof.

17. The method as claimed in claim 12, wherein the porous thin film is formed by applying the filling material, heat-treating the filling material at about 90° C. to about 200° C. under air, and increasing a temperature to about 250° C. to about 400° C. under a nitrogen atmosphere or vacuum.

18. The method as claimed in claim 12, wherein the porous thin film is formed by applying the filling material using a film adhering method or a liquid coating method.

19. The method as claimed in claim 18, wherein the porous thin film is formed by applying the filling material using the liquid coating method, the liquid coating method including spin coating, screen printing, inkjet, ODF (one drop filling), or a combination thereof.

20. The method as claimed in claim 12, wherein the porous thin film includes pores.

21. The method as claimed in claim 20, wherein the pores have a circular or oval shape.

22. The method as claimed in claim 20, wherein the pores have a pore diameter of about 1 nm to about 10 nm.

23. The method as claimed in claim 12, wherein the porous thin film has a thickness of about 1 μm to about 100 μm.

* * * * *